United States Patent [19]
Loh

[11] Patent Number: 5,115,298
[45] Date of Patent: May 19, 1992

[54] PACKAGED INTEGRATED CIRCUIT WITH ENCAPSULATED ELECTRONIC DEVICES

[75] Inventor: Wah K. Loh, Richardson, Tex.

[73] Assignee: Texas Instruments Incorporated, Dallas, Tex.

[21] Appl. No.: 470,673

[22] Filed: Jan. 26, 1990

[51] Int. Cl.⁵ .................. H01L 23/48; H01L 23/28; H01L 23/02; H01L 23/16
[52] U.S. Cl. ........................ 357/70; 357/72; 357/74; 357/75
[58] Field of Search ............. 357/70, 72, 74, 75, 357/81, 80

[56] References Cited

U.S. PATENT DOCUMENTS

| | | | |
|---|---|---|---|
| 4,595,945 | 6/1986 | Graver | 357/70 |
| 4,598,307 | 7/1986 | Wakabayshi et al. | 357/70 |
| 4,612,564 | 9/1986 | Moyer | 357/70 |
| 4,680,613 | 7/1987 | Daniels et al. | 357/70 |
| 4,862,245 | 8/1989 | Pashby et al. | 357/72 |
| 4,891,687 | 1/1990 | Mallik et al. | 357/74 |
| 4,916,519 | 4/1990 | Ward | 357/72 |
| 4,965,654 | 10/1990 | Karner et al. | 357/70 |

OTHER PUBLICATIONS

W. Ward, "Volume Production of Unique Plastic Surface-Mount Modules for the IBM 80-ns 1-Mbit DRAM Chip by Area Wire Bond Techniques", IEEE, 1988, pp. 552-557.

Primary Examiner—Andrew J. James
Assistant Examiner—Carl Whitehead, Jr.
Attorney, Agent, or Firm—Robby T. Holland; René E. Grossman; Richard L. Donaldson

[57] ABSTRACT

An integrated circuit device is disclosed. The device includes a first leadframe power supply bus and a second leadframe power supply bus that each have portions separate from and adjacent to one another that lie between a first plurality of leadfingers and a second plurality of leadfingers. An electronic device is connected to the first leadframe power supply bus and to the second leadframe power supply bus. Another electronic device can be connected to the first leadframe power supply bus and to the second leadframe bus. Exemplary of the electronic devices are a de-coupling capacitor and a capacitor for high frequency noise suppression. A semiconductor die is attached to the power supply busses. A substance encapsulates the components so that an integrated semiconductor chip is formed. A method of making an integrated circuit device is also disclosed.

28 Claims, 6 Drawing Sheets

PACKAGED INTEGRATED CIRCUIT WITH ENCAPSULATED ELECTRONIC DEVICES

FIELD OF THE INVENTION

This invention is related to semiconductor integrated circuit (IC) devices, and more particularly to an IC device without a chip support pad.

BACKGROUND OF THE INVENTION

An integrated circuit package generally includes an integrated circuit having an active face lying on a chip support pad connected to a leadframe and encapsulated by a material. Plastic is one example of an encapsulating material. The IC package is typically mounted to a printed circuit board. Reflow solder is one technique used to surface mount the IC package to a printed circuit board.

As the industry moves towards higher circuit densities and larger memory sizes, more stringent requirements are being placed on low frequency noise suppression (also known as power line de-coupling) and noise filtering systems on printed circuit boards. De-coupling, or bypass, capacitors are necessary to provide a temporary supply of charge to the integrated circuits as the output of power supplies connected to the integrated circuits varies. In this way, circuit operation is not compromised due to a temporary drop in voltage supply. To enhance de-coupling, these bypass capacitors need to be as close to the devices as possible in order for the inductance between the capacitors and the devices to be as small as possible.

Integrated circuits of higher densities and larger memory sizes have thinner di-electrics between their internal interconnect levels. As such, these circuits are much more susceptible to damage from noise spikes on power lines of the power supplies.

Designers of integrated circuit packages have chosen between including a low frequency noise suppression device or a high frequency noise suppression device with the IC package. This restriction exists as only one capacitor can be encapsulated with the integrated circuit chip in a single package. The difficulty in adding multiple capacitors in a package arises from the design of the conventional leadframe where the power supply pins and busses (Vss and Vdd) are spaced physically far apart from each other. This requires long interconnects or a long capacitor for electrically connecting the electrodes of the capacitor and the respective power pins. As frequency handling charecteristics differ for different capacitors, a single capacitor cannot handle both low end frequency and high end frequency noise noise suppression. Additionally, a long capacitor body can cause undue stresses on plastic encapsulated packages because of the different thermal expansion coefficients between the plastic encapsulant and the ceramic capacitor body. This causes package reliability problems. Concurrent over voltage spike protection has also not been possible.

FIG. 1a is a cross section view of a typical prior art IC device package 10. IC device package 10 is illustrated in the conventional plastic small outline J-leaded (PSOJ) surface mount package. A semiconductor die 11 is positioned by an epoxy 12a to a mount support pad 12b of leadframe 13. Wirebonds 14 are connected near the outer edges of semiconductor die 11 bonding semiconductor die 11 to leadfingers 15. An encapsulating material 16, plastic for example, surrounds semiconductor die 11, mount support pad 12b, leadframe 13, wirebonds 14, and parts of leadfingers 15 so that IC device package 10 can be surface mounted to a printed circuit board, not shown. A reflow solder process can be used to surface mount IC device package 10 to a printed circuit board.

FIG. 1b is a partial inside top view of prior art IC device package 10. In addition to leadframe 13, mount support pad 12b, and semiconductor die 11, illustrated are power supply busses 16 and 17. Power supply bus 16 delivers Vss and power supply bus 17 delivers Vdd. Power supply busses 16 and 17 are not adjacent to each other, but are spaced physically apart and are not near each other. If IC package device 10 contained a de-coupling capacitor for low frequency noise suppression, it would lie underneath mount pad 12 and be a long terminal device having its electrodes connected between Vss and Vdd. The de-coupling capacitor would necessarily be a long terminal device because power supply busses 16 and 17 are not adjacent to each other. Such a capacitor is illustrated in FIG. 1b as capacitor 19.

FIG. 2 is a partial cross section view of an alternative prior art IC device 10a having a de-coupling capacitor 19a conected across power supply lead 16a that supplies Vss and power supply lead 17a that supplies Vdd. Power supply leads 16a and and 17a are not adjacent to each other, but are across from each other. Decoupling capacitor 19a acts as the mount support pad to support semiconductor die 11a. The addition of an encapsulating substance, not shown, such as plastic would surround alternative IC device 10a to form an IC device package that can be mounted to a printed circuit board.

In the prior art devices of FIGS. 1a through 2, only a single electronic device can be connected to the power supply leads Vss and Vdd. The de-coupling capacitor has been illustrated. The designer could have chosen a high frequency noise suppression capacitor instead of the de-coupling capacitor. However, both a de-coupling capacitor and a high frequency noise suppression capacitor cannot be incorporated into the package device of FIGS. 1a through 2. The physical size of the capacitors, long bodies and electrodes, makes it not possible to encapsulate more than one in the package.

It is an object of this invention to provide an integrated circuit package device that has both low end frequency and high end frequency noise suppression.

It is a further object of this invention to provide an integrated circuit package device that has over voltage protection.

Other objects and benefits of this invention will be apparent to those skilled in the art based upon the description to follow herein.

SUMMARY OF THE INVENTION

An integrated circuit device is disclosed. The device includes a first leadframe power supply bus and a second leadframe power supply bus that each have portions separate from and adjacent to one another that lie between a first plurality of leadfingers and a second plurality of leadfingers. An electronic device is connected to the first leadframe power supply bus and to the second leadframe power supply bus. Another electronic device can be connected to the first leadframe power supply bus and to the second leadframe bus. Exemplary of the electronic devices are a de-coupling capacitor and a capacitor for high frequency noise suppression. A semiconductor die is attached to the power supply busses. A substance encapsulates the components so that an integrated semiconductor chip is formed. A method of making an integrated circuit device is also disclosed.

BRIEF DESCRIPTION OF THE DRAWINGS

Corresponding numerals on the figures refer to corresponding parts unless the context otherwise indicates.

DETAILED DESCRIPTION OF THE SPECIFIC EMBODIMENT

Figure 3A:
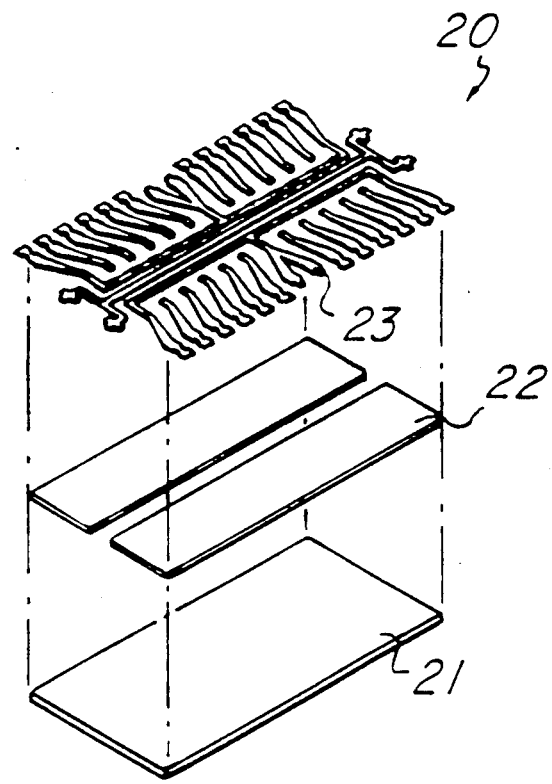
FIG. 3a is an exploded prespective view of a lead-over-chip device without an encapsulating material.

FIG. 3a is an exploded perspective view of a lead-over-chip device package 20 not showing the encapsulating material. A semiconductor die 21 is positioned below a lead-over-chip leadframe 23. A tape 22 lying between lead-over-chip leadframe 23 and semiconductor die 21 helps to position and bond semiconductor die 11 to lead-over-chip leadframe 23. A mount support pad is not used. The lead-over-chip device package 20 is of the PSOJ type.

Figure 1A:
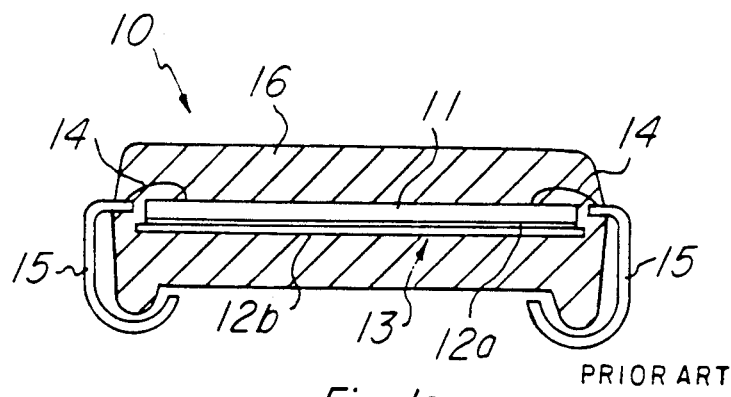
FIG. 1a is a cross section view of a typical IC device package.
Figure 1B:
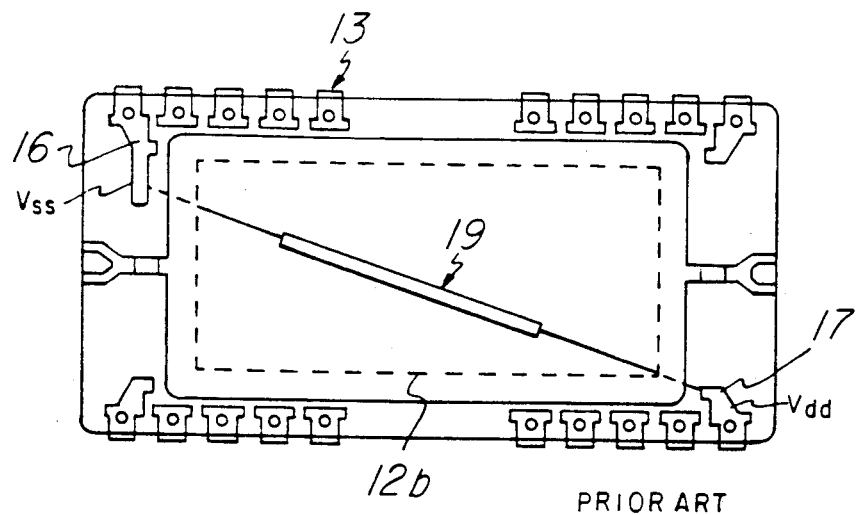
FIG. 1b is a partial inside top view of a typical IC device package illustrating a single capacitor connected across power supply leads Vss and Vdd.
Figure 2:
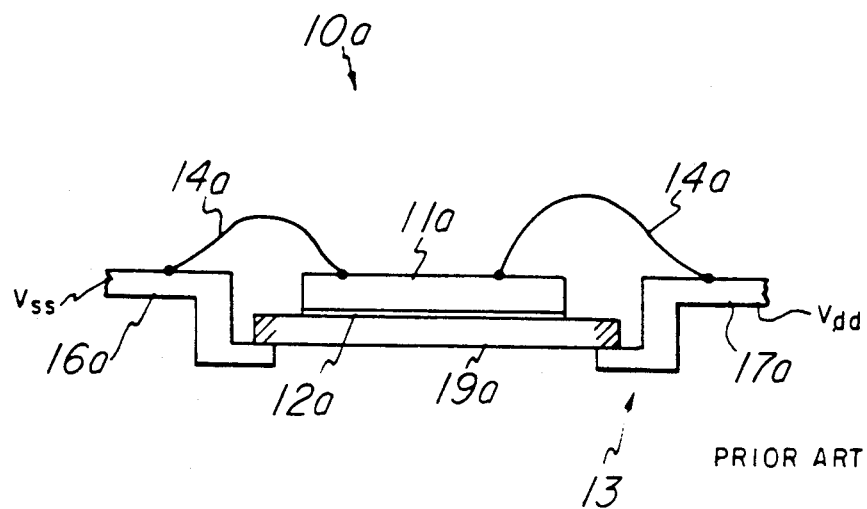
FIG. 2 is a partial cross section view of an alternative typical IC device having a capacitor connected across power supply leads Vss and Vdd.
Figure 3B:
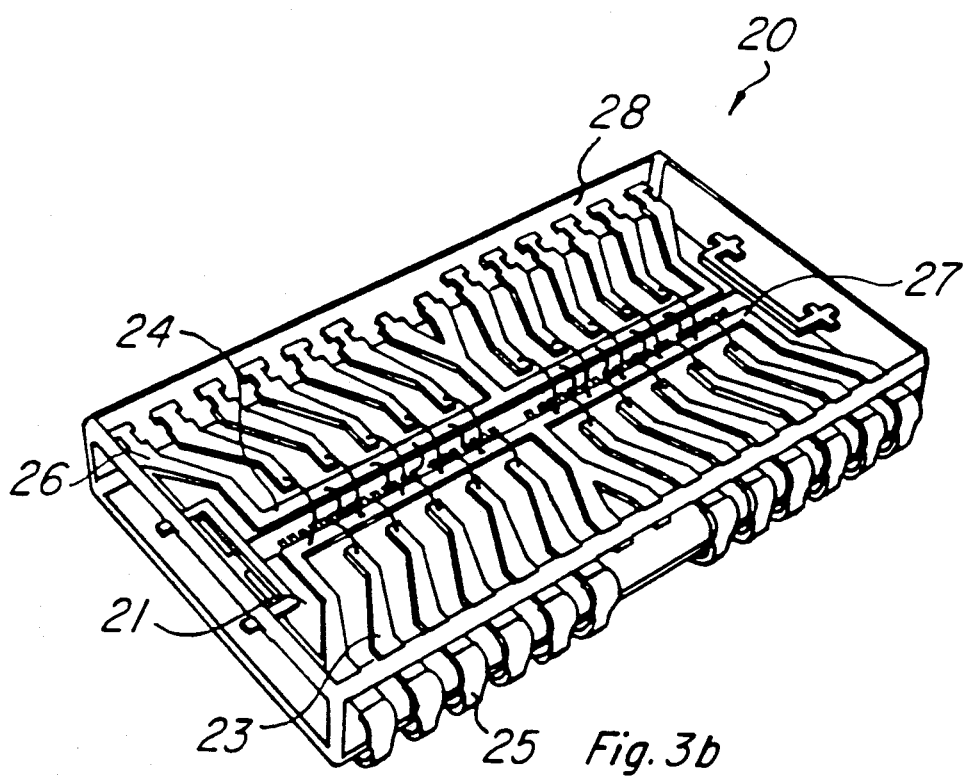
FIG. 3b is a view of a lead-over-chip device package wherein the encapsulating material is rendered transparent.

FIG. 3b is a view of lead-over chip device package 20 wherein an encapsulating material 28 is transparent. Wirebonds 24 are connected to bond pads on the die 21 near the center of semiconductor die 21 bonding semiconductor die 21 to lead-over-chip leadframe 23. The leadfingers 25 of lead-over-chip lead frame 23 are curved in the "J" shape as in FIG. 1; as is shown, leadfingers 25 of lead-over-chip leadframe 23 are an integral part of lead-over-chip leadframe 23.

Figure 3C:
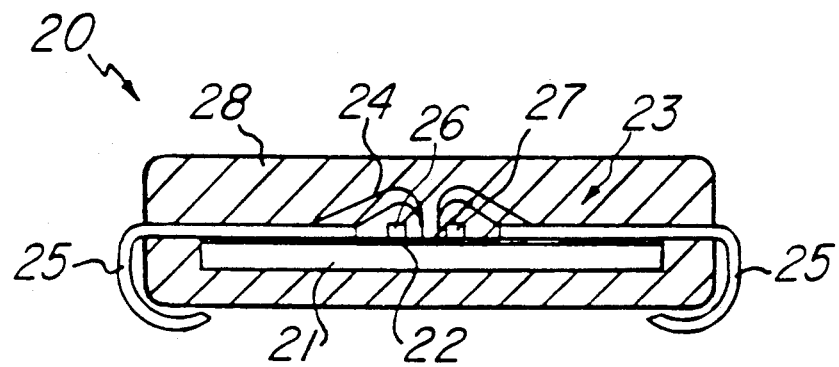
FIG. 3c is a cross section view of the lead-over-chip device package of FIG. 2b.

FIG. 3c is a cross section view of lead-over-chip device package 20. Wirebonds 24 are illustrated near the center of semiconductor die 21 and lead-over-chip leadframe 23. An encapsulating material 28, plastic for example, surrounds semiconductor die 21, tape 22, lead-over-chip leadframe 23, wirebonds 24, and parts of leadfingers 25 so that lead-over-chip device package 20 can be mounted to a printed circuit board, not shown. A reflow solder process can be used to surface mount lead-over-chip device package 20 to a printed circuit board.

Figure 4:
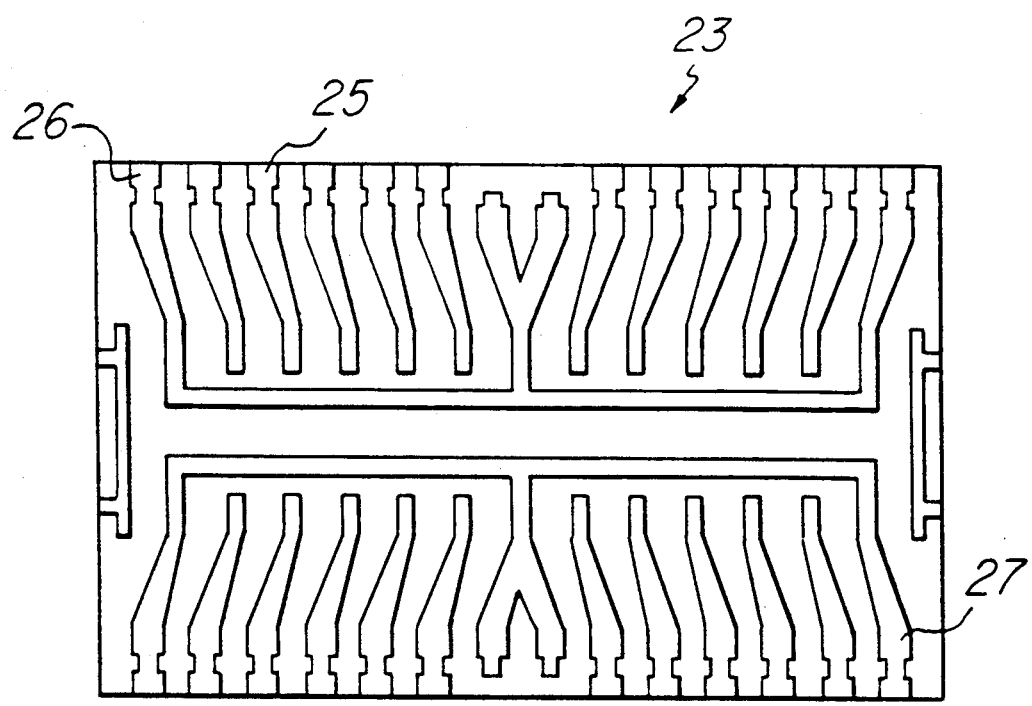
FIG. 4 is a top view of a lead-over-chip leadframe.

FIG 4 is a top view of lead-over-chip leadframe 23 illustrating power supply busses 26 and 27. Power supply bus 26 delivers Vss. Power supply bus 27 delivers Vdd. Power supply busses 26 and 27 are separate and adjacent to each other. They run parallel to each other in close proximity near the center of leadframe 23, lying between the plurality of leadfingers 25.

Figure 5:
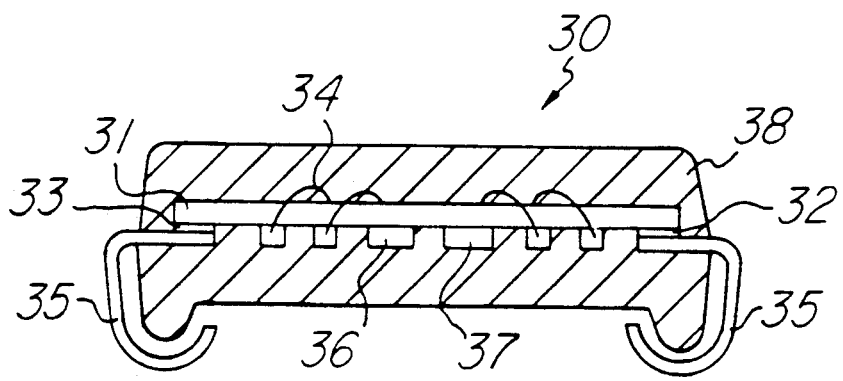
FIG. 5 is a cross section view of a chip-over-lead device package.

FIG. 5 is a cross section view of chip-over-lead device package 30. No mount support pad is used in this device package. A semiconductor die 31 is placed over a chip-over-lead leadframe 33. A tape 32 lying between semiconductor die 31 and chip-over-lead leadframe 33 helps to position and hold semiconductor die 11 in place until it is bonded to chip-over-lead leadframe 33. Power supply busses 36 and 37 are adjacent near the center of chip-over-lead leadframe 33. Power supply bus 36 delivers Vss. Power supply bus 37 delivers Vdd.

Figure 6:
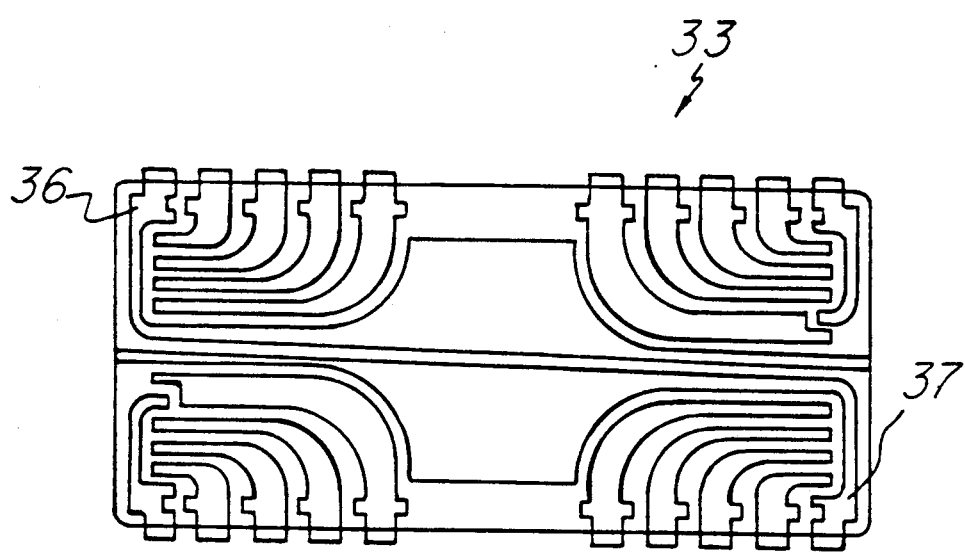
FIG. 6 is a top view of a chip-over lead leadframe.

FIG. 6 is a top view of chip-over-lead leadframe 33 illustrating more clearly power supply bus 36 delivering Vss and power supply bus 37 delivering Vdd.

Figure 7:
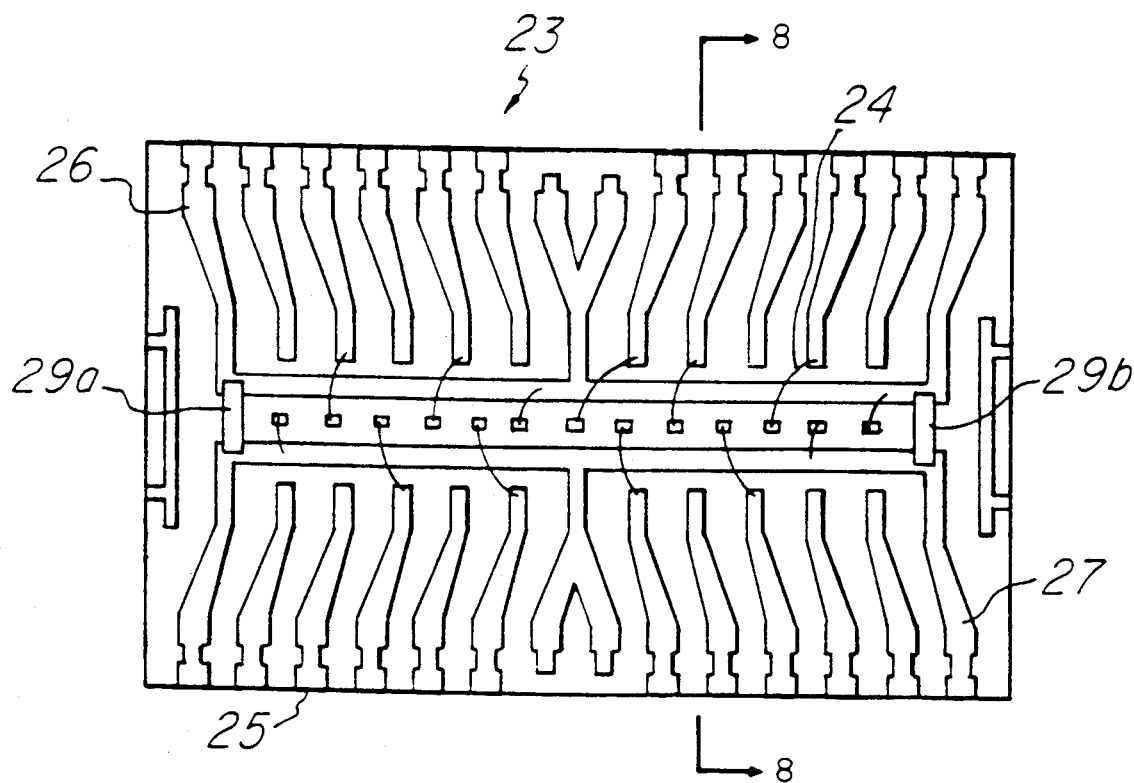
FIG. 7 is a top view of a lead-over chip leadframe having attached to it plural two-terminal electrical devices.

FIG. 7 is a top view drawing of lead-over-chip leadframe 23 of FIGS. 3a through 3b illustrating an embodiment of the invention wherein multiple electronic devices are attached across power supply busses 26 and 27. Electronic devices 29a and 29b each have two terminals. One terminal of each is attached to power supply bus 26 and the other terminal of each is attached to power supply bus 27. Because Vss power supply bus 26 and Vdd power supply bus 27 are separate from and adjacent to each other, the proximity can be taken advantage of by placing a capacitor or any electronic device across the busses as shown in FIG. 7. For example, electronic device 29a may be a low end frequency noise suppression capacitor and electronic device 29b may be a high end frequency noise suppression capacitor. By choosing the capacitance of each electronic device 29a and 29b, both high frequency noise suppression and de-coupling can occur simultaneously within and IC device package. In addition, voltage clamping device (such as a Zener diode, for instance) can be added across power supply busses 26 and 27 to limit and control voltage spikes. Electronic devices 29a and 29b are encapsulated with the IC device package. The absence of a mount support allows electronic devices 29a and 29b to be encapsulated within the IC device package. The IC device package still is a PSOJ package.

Figure 8:
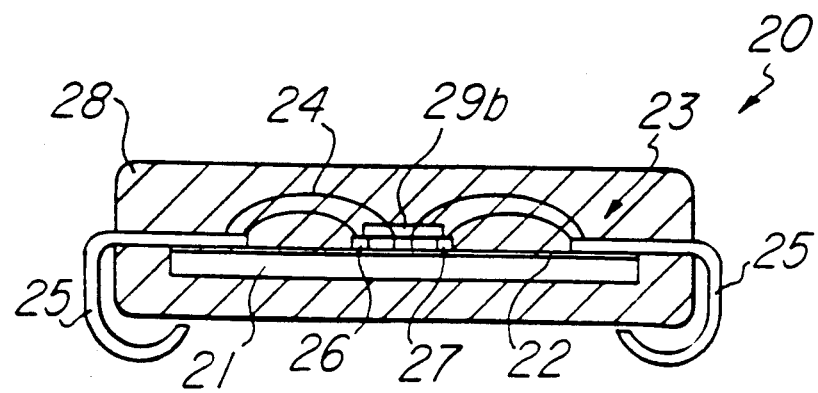
FIG. 8 is a cross section view of FIG. 7 illustrating the end of the package having two-terminal electrical device 29b connected across it's leadframe power supply busses.

FIG. 8 is a cross section view of FIG. 7 illustrating the end of the package having two-terminal electrical device 29b connected across portions of it's leadframe power supply busses. One end of electrical device 29b is connected to Vss power supply bus 26. The other end of electrical device 29b is connected to Vdd power supply bus 27. A wirebond 24 extends from one of leadfingers 25 to Vss power supply bus 26. Another of wirebonds 24 extends from another of leadfingers 25 to Vdd power supply bus 27. Power supply busses 26 and 27 lie between leadfingers 25. Additionally illustrated is encapsulating substance 28 that encapsulates electrical device 29b into the integrated circuit device package 20.

The proximity of the power supply busses to each other in the lead-over-chip leadframe of FIG. 7 allows the physical size of a capacitor placed across its power supply busses to be much smaller than that of any conventional IC device package. It is not necessary to use long interconnects or a long bodied capacitor.

Any active or passive electronic device having at least two terminals may be placed across power supply busses 26 and 27 of lead-over-chip leadframe 23 of FIG. 7. Illustrative are a capacitor, an inductor, a resistor, a diode, a Zener diode, a transistor, and a battery. Other electronic devices may also be utilized.

Figure 9A:
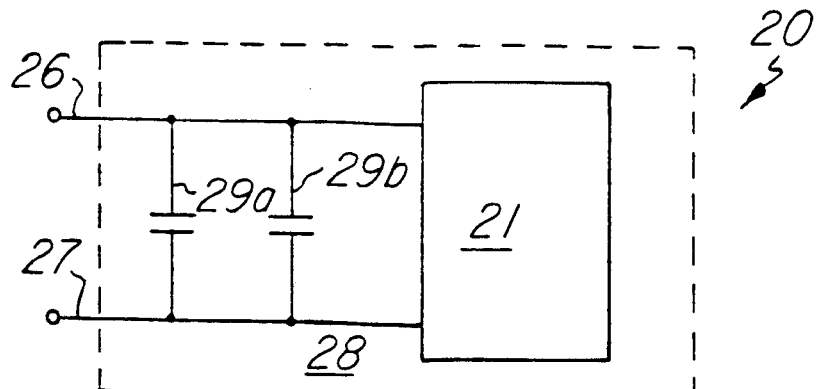
FIG. 9a is a partial electrical schematic diagram illustrating two encapsulated capacitors within an IC device package.
Figure 9B:
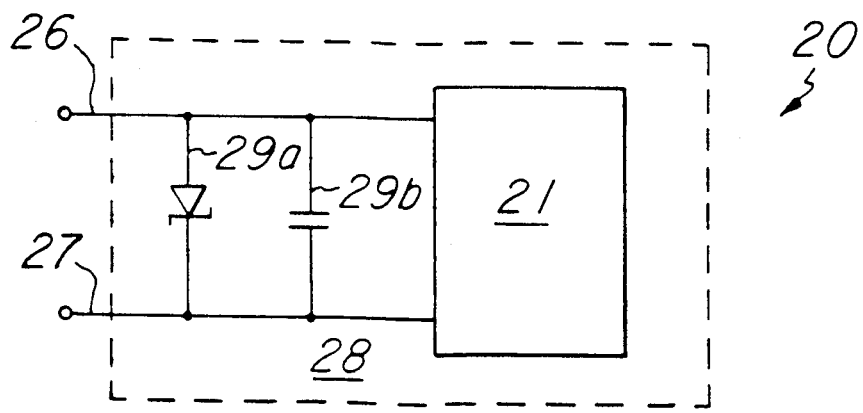
FIG. 9b is a partial electrical schematic diagram illustrating an encapsulated capacitor and an encapsulated Zener diode within an IC device package.
Figure 9C:
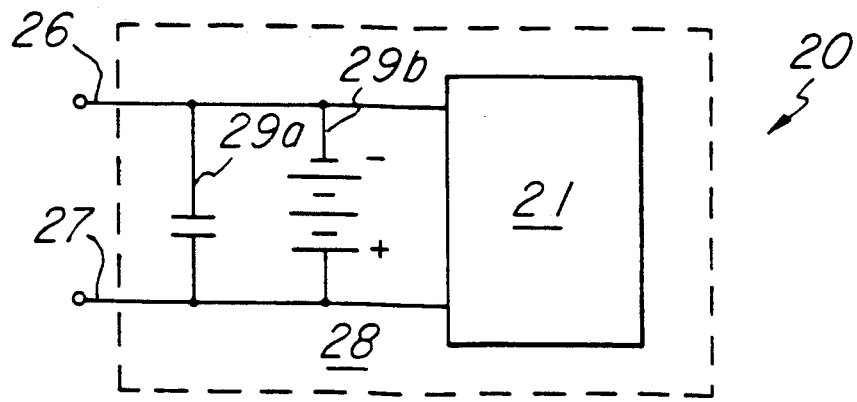
FIG. 9c is a partial electrical schematic diagram illustrating an encapsulated capacitor and an encapsulated battery within an IC device package.

FIGS. 9a through 9c are partial electrical schematic diagrams illustrating some of the various electrical devices that can be encapsulated within device package 20. FIG. 9a shows electronic devices 29a and 29b as capacitors connected across power supply busses 26 and 27. FIG. 9b shows electronic device 29a as a Zener diode and electronic device 29b as a capacitor. The anode of Zener diode 29a is connected to Vss power supply bus 26 while the cathode of Zener diode 29a is connected to Vdd power supply bus 27. FIG. 29c shows electronic device 29a as a capacitor while electrical device 29b is a battery having it's positive source of potential connected to Vdd power supply bus 27 and it's negative source of potential connected to Vss power supply bus 26.

Several methods can be used to assemble a lead-over-chip device package having an electronic device across its power supply busses. For instance, one method involves the use of preassembled surface mount ceramic capacitors. These capacitors are currently available commercially and offer capacitance as large as 1.8 uF and are still thin enough (3 mils) to fit inside the lead-over-chip leadframe package device of FIGS. 3a through 3c of about 100 mils. These capacitors can be premounted on the lead-over-chip leadframe with high temperature solder prior to the attachment of the die to the leadframe. In another method, preassembled surface mount capacitors can be attached by a conductive epoxy material during the die mount assembly process itself.

As the industry moves towards thinner (50 mils or thinner) packages for higher volumetric packageing densities on printed circuit boards, however, the encapsulation of the preassembled capacitors may pose a package height limitation. For these thinner packages, the use of single layer thin film capacitors may be substituted for the preassembled capacitors.

Of course, multiple capacitors and/or diodes can be mounted inside an IC device package having a chip-over-lead leadframe. It is envisioned that the method of placing an electronic device across the power supply busses of a lead-over-chip and a chip-over-lead leadframe works equally well with any leadframe package device that does not have a mount support pad, or equally well with any leadframe package device where the power supply busses of the leadframe are in close proximity to each other. For example, it is envisioned that the flip-chip package and the tabpak package both support this method.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of embodiments as fall within the true scope of the invention.

What is claimed is:

1. An integrated circuit device comprising:
   a first plurality of leadfingers;
   a second plurality of leadfingers;
   a first leadframe power supply bus having a portion lying between the first plurality of leadfingers and the second plurality of leadfingers;
   a second lead frame power supply bus having a portion lying between the first plurality of leadfingers and the second plurality of leadfingers;
   an electronic device connected to the first leadframe power supply portion and the second leadframe power supply portion; and
   another electronic device connected to the first leadframe power supply portion and the second leadframe power supply portion.

2. The integrated circuit device of claim 1 further comprising:
   a semiconductor die attached to the first plurality of leadfingers, the second plurality of leadfingers, the first power supply bus, and the second power supply bus.

3. The integrated circuit device of claim 2 further comprising:
   a substance encapsulating the first plurality of leadfingers, the second plurality of leadfingers, the first power supply bus, the second power supply bus, the electronic device, and the another electronic device in such a manner to form an integrated circuit chip.

4. An integrated circuit device comprising:
   a leadframe having a first power supply bus and a second power supply bus adjacent to each other;
   a first electronic device having at least two terminals, one terminal connected to the first power supply bus and the other terminal connected to the second power supply bus;
   a second electronic device having at least two terminals, one terminal connected to the first power supply bus and the other terminal connected to the second power supply bus; and
   a semiconductor die attached to the leadframe.

5. The integrated circuit device of claim 4 wherein the first electronic device and the second electronic device are capacitors.

6. The integrated circuit device of claim 5 further comprising:
   a substance to encapsulate the leadframe, the capacitors, and the semiconductor die.

7. The integrated circuit device of claim 6 wherein the substance is plastic.

8. The integrated circuit device of claim 6 wherein the leadframe is a lead-over-chip leadframe.

9. The integrated circuit device of claim 6 wherein the leadframe is a chip-over-lead leadframe.

10. The integrated circuit device of claim 6 wherein the leadframe is a flip-chip leadframe.

11. The integrated circuit device of claim 4 wherein the first electronic device is a capacitor and the second electronic device is a Zener diode.

12. The integrated circuit device of claim 11 further comprising:
   a substance to encapsulate the leadframe, the capacitor, the Zener diode, and the semiconductor die.

13. The integrated circuit device of claim 12 wherein the substance is plastic.

14. The integrated circuit device of claim 12 wherein the leadframe is a lead-over-chip leadframe.

15. The integrated circuit device of claim 12 wherein the leadframe is a chip-over-lead leadframe.

16. An integrated circuit device, comprising:
   a leadframe having two adjacent power supply busses to supply power to a semiconductor die and not having a semiconductor die support pad;
   an electronic device other than the semiconductor die connected across the two adjacent power supply busses; and
   another electronic device other than the semiconductor die connected across the two adjacent power supply busses.

17. The integrated circuit device of claim 16 wherein the electronics device suppresses low frequency noise and the another electronic device suppresses high frequency noise.

18. The integrated circuit device of claim 17 wherein the electronic device and the another electronic device are both capacitors.

19. The integrated circuit device of claim 18 wherein the leadframe is a lead-over-chip leadframe and further comprising:
   a semiconductor die attached to the leadframe; and
   a substance encapsulating the leadframe, the capacitors, and the semiconductor die thereby forming a package that is mountable on a printed circuit board.

20. The integrated circuit device of claim 19 wherein the substance is plastic.

21. The integrated circuit device of claim 18 wherein the leadframe is a chip-over-lead leadframe and further comprising:
   a semiconductor die attached to the leadframe; and
   a substance encapsulating the leadframe, the capacitors, and the semiconductor die thereby forming a package that is mountable on a printed circuit board.

22. The integrated circuit device of claim 21 wherein the substance is plastic.

23. The integrated circuit device of claim 16 wherein the electronic device suppresses low frequency noise and the another electronic device suppresses voltage spikes.

24. The integrated circuit device of claim 23 wherein the electronic device is a capacitor and the another electronic device is a Zener diode.

25. The integrated circuit device of claim 24 wherein the leadframe is a lead-over-chip leadframe and further comprising:
   a semiconductor die attached to the leadframe; and
   a substance encapsulating the leadframe, the capacitor, the Zener diode, and the semiconductor die thereby forming a package that is mountable on a printed circuit board.

26. The integrated circuit device of claim 25 wherein the substance is plastic.

27. The integrated circuit device of claim 24 wherein the leadframe is a chip-over-lead leadframe and further comprising:
   a semiconductor die attached to the leadframe; and
   a substance encapsulating the leadframe, the capacitor, the Zener diode, and the semiconductor thereby forming a package that is mountable on a printed circuit board.

28. The integrated circuit device of claim 27 wherein the substance is plastic.

* * * * *